(12) United States Patent
Menut et al.

(10) Patent No.: US 8,995,160 B2
(45) Date of Patent: Mar. 31, 2015

(54) ELECTRONIC COMPONENT INCLUDING A MATRIX OF TCAM CELLS

(71) Applicant: STMicroelectronics S.A., Montrouge (FR)

(72) Inventors: Olivier Menut, Saint-Martin-d'Heres (FR); David Turgis, Le Touvet (FR); Lorenzo Ciampolini, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 14/280,955

(22) Filed: May 19, 2014

(65) Prior Publication Data

US 2014/0347907 A1 Nov. 27, 2014

(30) Foreign Application Priority Data

May 24, 2013 (FR) ...................................... 13 54714

(51) Int. Cl.
*G11C 15/00* (2006.01)
*G11C 15/04* (2006.01)

(52) U.S. Cl.
CPC .............. *G11C 15/046* (2013.01); *G11C 15/04* (2013.01)
USPC .................... 365/49.17; 365/49.1; 365/49.15; 365/49.16; 365/51

(58) Field of Classification Search
CPC .............................. G11C 15/046; G11C 15/04
USPC .................. 365/49.17, 49.1, 49.15, 49.16, 51
See application file for complete search history.

(56) References Cited

U.S. PATENT DOCUMENTS

| | | | |
|---|---|---|---|
| 6,721,202 B1 * | 4/2004 | Roge et al. ..................... | 365/168 |
| 6,781,857 B1 | 8/2004 | Lien et al. | |
| 6,856,527 B1 * | 2/2005 | Srinivasan et al. ........... | 365/49.1 |
| 7,126,834 B1 * | 10/2006 | Meng et al. ................ | 365/49.11 |
| 7,170,769 B1 * | 1/2007 | Sachan et al. .............. | 365/49.15 |
| 7,251,147 B1 * | 7/2007 | Maheshwari .............. | 365/49.17 |
| 7,286,379 B1 * | 10/2007 | Sun ............................. | 365/49.17 |
| 7,417,882 B1 * | 8/2008 | Maheshwari .............. | 365/49.16 |
| 7,450,409 B1 * | 11/2008 | Maheshwari ................ | 365/49.1 |
| 7,570,503 B1 * | 8/2009 | Maheshwari et al. ....... | 365/49.1 |
| 7,924,588 B2 * | 4/2011 | Arsovski et al. ........... | 365/49.17 |
| 8,553,441 B1 * | 10/2013 | Argyres ..................... | 365/49.17 |
| 2001/0033508 A1 | 10/2001 | Waller | |
| 2003/0005210 A1 * | 1/2003 | Thummalapally et al. ....... | 711/1 |

OTHER PUBLICATIONS

French Search Report and Written Opinion dated Jan. 14, 2014 from corresponding French Application No. 13/54714.

* cited by examiner

*Primary Examiner* — Viet Q Nguyen
(74) *Attorney, Agent, or Firm* — Allen, Dyer, Doppelt, Milbrath & Gilchrist, P.A.

(57) ABSTRACT

Electronic component including a ternary content-addressable memory component, configured to compare the input data items with a set of pre-recorded reference data words; the memory component incorporates a matrix of elementary cells arranged in lines and columns; each line incorporates cells in each of which is recorded one bit of one of the reference data words; the cells of a given column are dedicated to the comparison of the same bit of the input data word; each cell incorporates: two memory points storing the data representing the reference data bit; a comparison circuit connected to the memory points, with a comparison point of which the potential represents the comparison if the input data bit and the data stored in the memory points, and also incorporating a common comparison circuit to which are connected the comparison circuits of all or part of the cells of a given column; the comparison circuit incorporates terminals to which the bit from the input data word and its complement are applied.

3 Claims, 1 Drawing Sheet

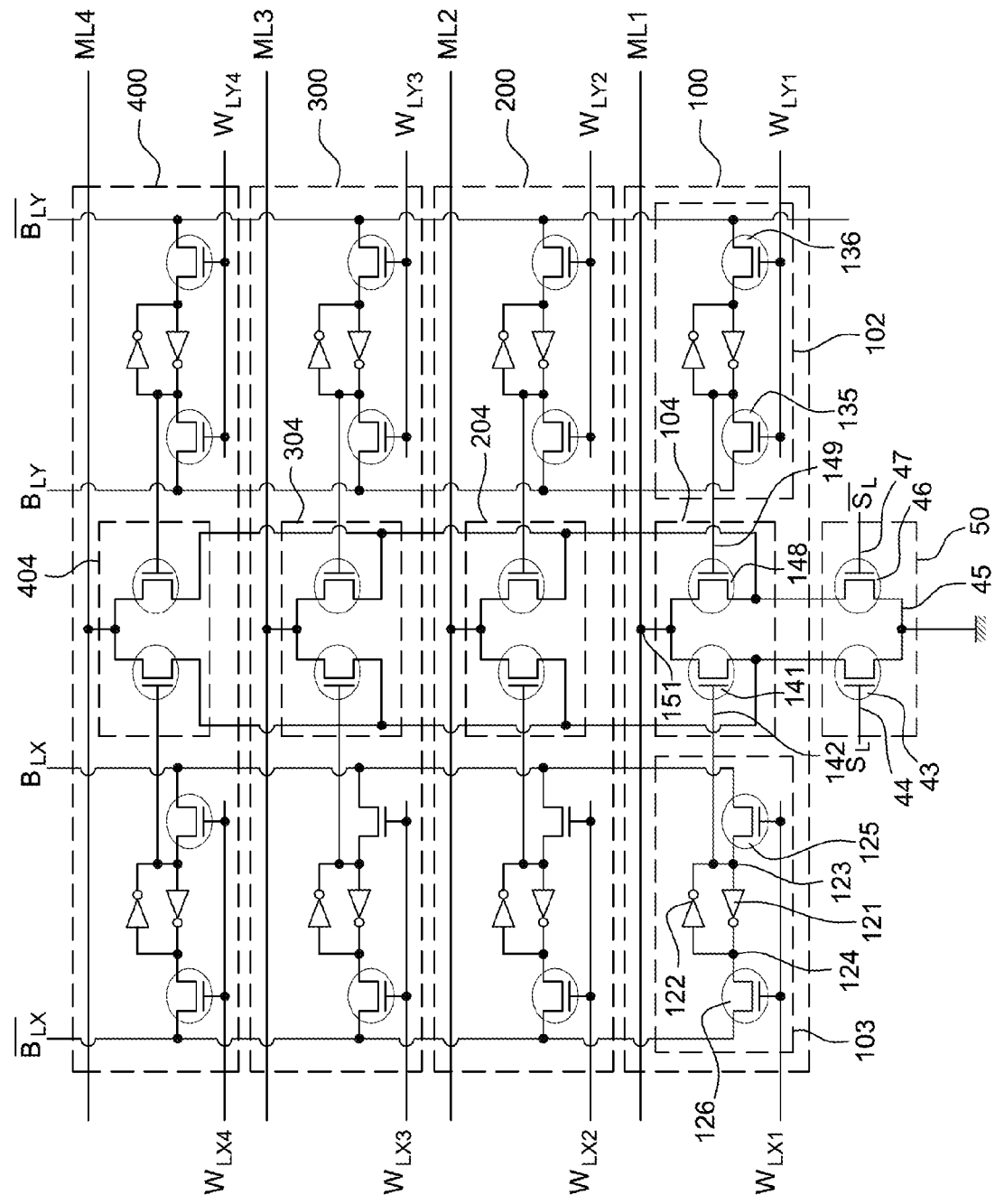

US 8,995,160 B2

ELECTRONIC COMPONENT INCLUDING A MATRIX OF TCAM CELLS

CROSS REFERENCE TO RELATED APPLICATIONS

This application claims the priority benefit of French Patent Application No. 13/54714, filed May 24, 2013, and which application is hereby incorporated by reference to the maximum extent allowable by law.

BACKGROUND

1. Technical Field

Embodiments concern the field of microelectronics—more precisely that of memory circuits and, more specifically, content-addressable memory components, notably ternary content.

More particularly, the embodiments concern architectures for this type of memory allowing one to improve performances in terms of operating speed and/or power consumption.

2. Discussion of the Related Art

Memory components of CAM ("Content-Addressable Memory") type are memory components that allow a comparison between a set of data to search and a set of pre-recorded data (or key data), so as to detect a correspondence between the data searched and the pre-recorded data.

This kind of memory has an appropriate application in routing systems, in which the address of a data packet recipient needs to be identified in the list of addresses of possible recipients recorded within a system, so that the packet is routed via the port of the device to which the installation of the address is being searched is connected.

To do this, CAM-type memory components have a number of cells arranged in a matrix of lines and columns. Conventionally, each line contains the different bits of a data word for which the comparison with the key data is performed bit by bit, at the level of each cell. Conventionally, therefore, each cell incorporates a memory point within which the corresponding bit of the key data word is recorded, and a comparison circuit allowing the pre-recorded data bit to be recorded with the same-magnitude bit of the data to be searched.

When the comparison is positive, i.e. when the bit of the key data item matches with the same-magnitude bit of the searched data item, then the comparison circuit sets a comparison point to a given state—generally low—of a match line, shared between the different bits of the same word, i.e. of a same line. Because this match line is shared by all the cells of a given line, its potential is at the given level—typically low—when all the cells of a given line return a bit-to-bit match.

Among the various existing CAM memory components, a particular type called TCAM ("Ternary Content-Addressable Memory") enables one to implement more-sophisticated comparison functions. In particular, with this type of memory, it is possible to conclude on a match without taking account of the value of all or part of the bits of a data word to be searched.

In other words, certain cells of the memory are configured to send a match signal regardless of the level of all or part of the bits of a word.

To implement this function of masking certain bits, it is possible to implement a particular architecture of cells, in which each cell incorporates two memory points or storage circuits, so as to compare the value of the bit to be searched with the value of the pre-recorded bit and its complement, which are each stored in their memory point.

More precisely, the comparison circuit verifies that the key data bit is at a high level at the same time as the bit of the first memory point, or that the complement of the key data word bit is also at a level at the same time as the second memory point, in which the complement of the bit recorded in the first memory point is nominally recorded.

However, when the first and second memory point are not saved with complementary data, the comparison circuit can issue a match signal regardless of the level of the input bit and its complement.

In practice, in CMOS technology, the comparison circuits are implemented using N-MOS-type transistors arranged to implement an "exclusive OR" function between the data from, firstly, the two memory points and, secondly, the input bit and its complement.

Yet, one can conceive that an increase in the capacity of CAM memory components, i.e. the quantity of key data items with which a search data item is to be compared, gives rise to an increase in the power consumed by the memory, because all the comparison circuits are active during the search operations. This tendency towards an increase in power consumption is even more sensitive with the increase in operating frequencies. This is because, to enable the comparison circuit to operate at a higher frequency, it is necessary to use transistors that switch quickly, and that have a considerable output current. Thus, these transistors are relatively large, which augments their interference capability and, therefore, the overall power consumed.

SUMMARY

It would therefore be desirable to have a TCAM memory architecture that can operate at higher frequency and/or with large capacities in terms of size of key data items, and that can achieve this without excessively increasing the power consumed—or even with a power consumption decrease.

One embodiment provides a ternary content-addressable memory component that is configured to compare input binary data with a set of reference binary data items, with the said memory component incorporating a matrix of elementary cells arranged in lines and columns, with each line incorporating cells within each one of which one bit of one of the reference data words is recorded, and with the cells of a given column being dedicated to the comparison of the same bit of the input data word, with each cell including:

two memory points within which the data items representing the reference data bit are stored;
  a comparison circuit connected to the said memory points, having a comparison point of which the potential represents the comparison of the bit from the input data item and the data items stored in the said memory points, and also incorporating a common comparison circuit to which are connected the comparison circuits of all or part of the cells of a given column, the said comparison circuit incorporating terminals to which the bit of the input data word and its complement are applied.

In one implementation, the comparison circuit of each cell includes two transistors of which the gates are each connected to a memory point, and of which the drains are connected to the comparison point.

In one implementation, the comparison circuit incorporates transistors, namely:
  a first transistor of which:
    the gate is connected to the terminal to which the bit from the top of the input;

the drain is connected to the source of one of the transistors of the comparison circuit of the cells connected to the common comparison circuit;

the source is connected to a low common point;

and a second transistor:

of which the gate is connected to the terminal to which the complement of the input data word bit is applied;

the drain is connected to the source of the other transistor of the comparison circuit of the cells that are connected to the common comparison circuit.

BRIEF DESCRIPTION OF THE DRAWINGS

Certain aspects, particularly characteristics and advantages, will come to the fore in the description that follows of particular implementations provided as non-limitative illustrations, and illustrated in the appended figure, which is a simplified schematic of a section of TCAM memory cells matrix.

DETAILED DESCRIPTION

The example illustrated in the Figure is a set of four TCAM memory cells of XY type, i.e. in which the data item to search for (and its complement) are compared with two memory points.

Therefore, FIG. 1 illustrates four identical cells—100, 200, 300 and 400—of which only one will be described in detail. Thus, the cell 100 incorporates two memory points—102 and 103—associated with a comparison circuit 104, which is itself connected at its high point to a match line ML1, and connected at its low point to a common comparison circuit 50, which which will be described in detail further on. Each of the memory points 102 and 103 are of conventional composition, incorporating two inventors—121 and 122—mounted antiparallel, of which the connection points 123 and 124 are set to a potential representing the data item stored in the memory point 102, which is also referred to as a "storage circuit".

The common points—123 and 124—of connection of the reversers—121 and 122—are connected by transistors—125 and 126—to BLX and /BLX bit lines. These BLX and /BLX bit lines enable writing and reading of the memory point 102, when the pass-gate transistors—125 and 126—are set to pass by application of the appropriate instruction on the WLX1 word line.

Obviously, the memory point—described here with a structure of 6T type including six transistors—can be replaced by other types of memory points incorporating, for example, more transistors.

The second memory point 103 of the cell has a composition identical to that of the memory point 102. The pass-gate transistors—135 and 136—are respectively connected to the BLY and /BLY bit lines, to enable read/write operations on this memory point 103 when the WLY1 word line is at an appropriate potential.

Obviously, it is possible to make the two memory points depend on the same word line controlling reading/writing or, as in the form illustrated, have the word lines dedicated to just one half of the memory points of the cells assigned to a given word.

Similarly, in the illustrated form, the BLX and BLY bit lines of the two memory points—102 and 103—are separate and independent, which enables the two memory points—102 and 103—to be assigned totally-separate data items. However, in certain TCAM memory configurations, it is possible for the two bit lines to be shared, so that the two memory points are supplied with the same data items, with the comparison circuit being connected to two complementary points. However, the implementation such as illustrated in the Figure allows one to conduct more-sophisticated comparisons—notably masking providing a match signal for any level of the bit to be searched.

In the implementation in the Figure, the comparison circuit 104 is composed of two transistors which, in the illustrated form, are of N-MOS type.

A first transistor 141 presents its gate 142, which is connected to point 123 of the memory point 102. Thus, this transistor is set to pass when the data item present on the memory point 102 is at 1 (or, more generally, at high level). It is blocked when this memory point is at 0 (or, reciprocally, at a low level).

The drain of the transistor 141 is connected to a common point 150, also referred to as the comparison point, which is at a potential that depends on the state of the transistors 141 and 148 of the comparison circuit 104 and the common comparison circuit 50.

More precisely, the common comparison circuit 50 incorporates a first transistor 43 of which the gate 44 is connected to the SL line to which the input binary data item to be searched for is applied. The drain of the transistor 43 is connected to the source of the transistor 141 of the comparison circuit 104 of the cell 100. Symmetrically, the common comparison circuit 50 incorporates a second transistor 46, of which the grid 47 is connected to the gate to which the complement /SL of the data item applied to the SL line is applied. The source of transistor 47 is also connected to the low common point 45, and the drain of the transistor 47 is connected to the source of the transistor 148 of the comparison circuit 104 of the cell 100. Thus, when the data item to be searched for, SL, is at 1, the transistor 44 passes; it is blocked when this data item is set to 0; symmetrically, the transistor 46 passes when the data item applied to the SL line is at 1; conversely, it is blocked when when data item SL is set to 1. Thus when the data item present on the SL line is at 1 and the data item present on the memory point 102 is also at 1, the branch formed from transistors 141 and 43 sets the point 150 to the potential of the low point 45. The transistors of the other branch—i.e. transistors 148 and 46—are blocked, as is the transistor 46 since the value on the /SL line is 0.

Consequently, the point 150 remains at a high potential imposed by a conventional charging circuit, which will not be described in detail. Thus, this high potential corresponds to a non-match with the data item circulating on the SL line and on the memory point 102. In the specific configuration in which the two memory points 102 and 103 store 1 values, one or other of the transistors 43, 46 passes, such that the point 50 is connected to the low point 45, regardless of the value circulating on the search line SL. This corresponds to a match case, regardless of the value of the bit searched for—the which case is also referred to as an "always-miss".

In a complementary manner, when the values stored in the two memory points 102 and 103 are both at 0, the two transistors 141 and 142 of the comparison circuit remain blocked, so the comparison point 150 and, therefore, the match line ML1 remain at a high potential, whatever the value circulating on the SL line. This is therefore a case in which a match cannot be attained, which is also referred to as an "always-hit".

Obviously, the truth table corresponding to the various scenarios—particularly for ternary operation—on the point at which the grids of the transistors of the comparison circuit 104 are connected to the memory points vis-a-vis the BLX, /BLX bit lines.

According to the implementation illustrated in the Figure, the other cells 200, 300, 400 of a given column see their comparison circuit 204, 304, 404 also connected to the common comparison circuit 50, in the same way as the circuit 104.

Thus, the cells 100, 200, 300, 400 share access to the data of the bit to be searched for, SL, so that the surface occupied by the global comparison circuit, combining the part dedicated to each cell, and the common portion connected to the input data, is less than for a conventional TCAM memory cell.

This is because, in a conventional TCAM memory architecture, each cell includes a comparison circuit performing an XOR function. Each cell receives the data of the bit to be searched for, SL, as input. Consequently, through this partially-shared architecture, the surface area and overall consumption of the cell is decreased, because one of the two transistors of the common comparison circuit 50 always passes during the search phases.

Of course, this sharing of the common comparison circuit to which the bit to be searched for is applied can be done for all or part of the cells of a given column. Thus it is possible to group certain cells of a given column into subsets assigned to a common comparison circuit. Because the number of cells in this subset is governed by considerations pertaining to the power consumed by the transistors of the common comparison circuit, and the length of the connections necessary to connect the comparison circuits of each cell with the common comparison circuit.

It can be seen from the above explanations that the implementations described allow one to design TCAM memory components that consume particularly little current in relation to the memory components of current art, enabling their operation at higher frequencies, also increasing the global capacities of the memory in terms of number of cells.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Electronic component including a ternary content-addressable memory component configured to compare the input data with a set of pre-recorded reference memory words, with the memory component incorporating a matrix of elementary cells arranged in lines and columns; each line incorporates cells in each of which is recorded one bit of one of the reference data words; the cells of a given column are dedicated to the comparison of the same bit of the input data word; each cell includes:

two memory points storing the data representing the reference data bit;

one comparison circuit connected to the memory points, with a comparison point of which the potential represents the comparison of the input data bit and the data stored in the memory points, and also incorporating a common comparison circuit to which the comparison circuits of all or part of the cells of a given column; the comparison circuit incorporates terminals to which the bit from the input data word and its complement are applied.

2. Component according to claim 1, in which the comparison circuit of each cell incorporates two transistors the gates of which are each connected to a memory point, and the drains of which are connected to the comparison point.

3. Component according to claim 2, in which the common comparison circuit incorporates two transistors, namely:

one initial transistor of which:
  the gate is connected to the terminal to which the bit from the top of the input is applied;
  the drain is connected to the source of one of the transistors of the comparison circuit of the cells connected to the common comparison circuit;
  the source is connected to a low common point;

and a second transistor:
  of which the gate is connected to the terminal to which the complement of the input data word bit is applied;
  the drain is connected to the source of the other transistor of the comparison circuit of the cells that are connected to the common comparison circuit;
  the source is connected to the said common low point.

* * * * *